US012672432B2

(12) United States Patent
Luo

(10) Patent No.: US 12,672,432 B2
(45) Date of Patent: Jun. 30, 2026

(54) ORGANIC LIGHT-EMITTING DIODE DISPLAY SUBSTRATE, DISPLAY PANEL AND MANUFACTURING METHOD THEREOF, AND DISPLAY DEVICE

(71) Applicant: BOE Technology Group Co., Ltd., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1149 days.

(21) Appl. No.: 17/283,972

(22) PCT Filed: Jun. 15, 2020

(86) PCT No.: PCT/CN2020/096174
§ 371 (c)(1),
(2) Date: Apr. 9, 2021

(87) PCT Pub. No.: WO2020/253654
PCT Pub. Date: Dec. 24, 2020

(65) Prior Publication Data
US 2021/0351387 A1      Nov. 11, 2021

(30) Foreign Application Priority Data
Jun. 19, 2019   (CN) ......................... 201910530643.X

(51) Int. Cl.
*H10K 59/122*      (2023.01)
*H10K 59/80*      (2023.01)
*H10K 71/00*      (2023.01)

(52) U.S. Cl.
CPC ....... *H10K 59/122* (2023.02); *H10K 59/8722* (2023.02); *H10K 71/00* (2023.02); *H10K 59/873* (2023.02)

(58) Field of Classification Search
CPC .... H10K 71/00; H10K 50/844; H10K 59/122; H10K 50/8426; H10K 59/8722; H10K 71/135; H10K 59/873; H10K 59/126
See application file for complete search history.

(56) References Cited

U.S. PATENT DOCUMENTS 10,388,912 B2 *   8/2019   Choi ...................... H10K 50/11
10,672,838 B2 *   6/2020   Nishikiori .............. H10K 71/40
(Continued)

FOREIGN PATENT DOCUMENTS

CN       104062811 A     9/2014
CN       107104202 A     8/2017
(Continued)

OTHER PUBLICATIONS

First office action of Chinese application No. 201910530643.X issued on Dec. 7, 2020.
(Continued)

*Primary Examiner* — Fernando L Toledo
*Assistant Examiner* — Jahae Kim
(74) *Attorney, Agent, or Firm* — Lippes Mathias LLP

(57) ABSTRACT

An OLED display panel includes: a display substrate including a display region and a non-display region surrounding the display region; a retaining wall which is located in the non-display region and surrounds the display region; a residual layer located between the retaining wall and the display region; a plurality of light-emitting structures in the display region; and a packaging structure which covers a plurality of light-emitting structures and is connected to the residual layer and the display substrate.

10 Claims, 5 Drawing Sheets

(56)                    References Cited

U.S. PATENT DOCUMENTS

| | | | |
|---|---|---|---|
| 10,923,681 B2 * | 2/2021 | Wang ................. | H10K 59/8722 |
| 2011/0291117 A1 | 12/2011 | Kwack et al. | |
| 2014/0197394 A1 * | 7/2014 | Otsuka ................... | H10K 59/35 |
| | | | 438/46 |
| 2015/0362780 A1 | 12/2015 | Zhan et al. | |
| 2017/0155088 A1 | 6/2017 | Kim et al. | |
| 2019/0198811 A1 * | 6/2019 | Choi .................... | H10K 59/874 |
| 2019/0221775 A1 | 7/2019 | Wang | |
| 2022/0216278 A1 * | 7/2022 | Lee ........................ | H10K 71/00 |
| 2024/0065023 A1 * | 2/2024 | Kanaya ............... | H10K 50/167 |

FOREIGN PATENT DOCUMENTS

| CN | 108321308 A | | 7/2018 | | |
|---|---|---|---|---|---|
| CN | 110224013 A | | 9/2019 | | |
| CN | 107845667 B | * | 5/2020 | ......... | H01L 27/3223 |
| CN | 110364639 B | * | 3/2022 | | |
| KR | 102646659 B1 | * | 3/2024 | .............. | H10P 76/00 |

OTHER PUBLICATIONS

Notification to grant patent right for invention of Chinese application No. 201910530643.X issued on Jul. 1, 2021.

* cited by examiner

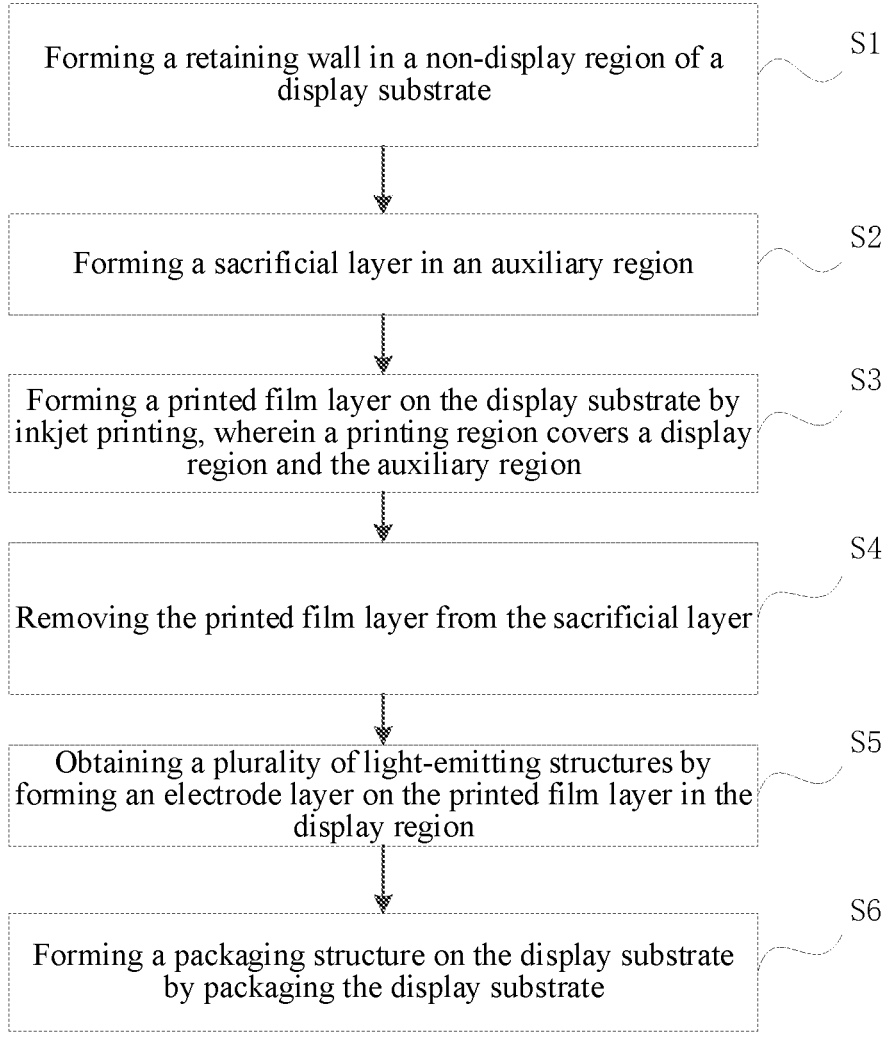

Forming a retaining wall in a non-display region of a display substrate    S1

Forming a sacrificial layer in an auxiliary region    S2

Forming a printed film layer on the display substrate by inkjet printing, wherein a printing region covers a display region and the auxiliary region    S3

Removing the printed film layer from the sacrificial layer    S4

Obtaining a plurality of light-emitting structures by forming an electrode layer on the printed film layer in the display region    S5

Forming a packaging structure on the display substrate by packaging the display substrate    S6

FIG. 9

ORGANIC LIGHT-EMITTING DIODE DISPLAY SUBSTRATE, DISPLAY PANEL AND MANUFACTURING METHOD THEREOF, AND DISPLAY DEVICE

CROSS-REFERENCE TO RELATED APPLICATIONS

The present application is a 371 of PCT Application No. PCT/CN2020/096174, filed on Jun. 15, 2020, which claims priority to Chinese Patent Application No. 201910530643.X, filed on Jun. 19, 2019 and entitled "DISPLAY PANEL AND MANUFACTURING METHOD THEREOF, AND DISPLAY DEVICE," the entire content of which is incorporated herein by reference.

TECHNICAL FIELD

The present disclosure relates to the field of display technologies, and in particular, to an OLED display substrate, a display panel and a manufacturing method thereof, and a display device.

BACKGROUND

As a new generation of display technology, organic light-emitting diodes (OLEDs) have a wide application prospect due to their high responsivity, high contrast, flexibility and other advantages. An inkjet printing technology in film forming technologies of the OLED is regarded as an important way to realize mass production of large-size OLEDs due to its high material utilization rate.

SUMMARY

Embodiments of the present disclosure provide an organic light-emitting diode (OLED) display substrate, a display panel and a manufacturing method thereof, and a display device.

At least one embodiment of the present disclosure provides an OLED display panel. The OLED display panel includes:

a display substrate including a display region and a non-display region surrounding the display region;

a retaining wall which is located in the non-display region and surrounds the display region;

a residual layer located between the retaining wall and the display region;

a plurality of light-emitting structures located in the display region; and a packaging structure which covers the plurality of light-emitting structures and is connected to the residual layer and the display substrate.

Optionally, the residual layer is made of a soluble material soluble in a solvent, and an organic light-emitting functional layer of the light-emitting structure is insoluble in the solvent.

Optionally, the soluble material includes at least one of polyethylene glycol, polycaprolactone, polyvinyl alcohol, polyvinylpyrrolidone, and polymethyl methacrylate.

Optionally, the residual layer includes a plurality of unconnected residual portions dispersed between the retaining wall and the display region.

Optionally, the display panel further includes a pixel defining layer; wherein the pixel defining layer is located in the display region; or the pixel defining layer is located in a region surrounded by the retaining wall, and defines a plurality of auxiliary pixel regions in a region between the retaining wall and the display region, wherein the residual layer is located in the auxiliary pixel region.

Optionally, the pixel defining layer and the retaining wall are located in a same layer.

Optionally, the display panel further includes a moisture and oxygen barrier layer in the non-display region, wherein the moisture and oxygen barrier layer covers a surface of the retaining wall.

Optionally, the moisture and oxygen barrier layer further covers a surface of the display substrate on at least one side of the retaining wall.

Optionally, the packaging structure includes:

a packaging cover plate disposed opposite to the display substrate; and a packaging adhesive adhered between the display substrate and the packaging cover plate, wherein the packaging adhesive is located in the non-display region and at least partially located in the auxiliary region.

At least one embodiment of the present disclosure provides an OLED display substrate. The OLED display substrate includes:

a display substrate including a display region and a non-display region surrounding the display region;

a retaining wall which is located in the non-display region and surrounds the display region;

a sacrificial layer located between the retaining wall and the display region;

a plurality of light-emitting structures located in the display region, wherein the light-emitting structure includes an organic light-emitting functional layer; and an organic layer located on the sacrificial layer, wherein the organic layer and the organic light-emitting functional layer are located in a same layer.

Optionally, the sacrificial layer is made of a soluble material soluble in a solvent, and the organic light-emitting functional layer is insoluble in the solvent.

Optionally, the soluble material includes at least one of polyethylene glycol, polycaprolactone, polyvinyl alcohol, polyvinylpyrrolidone, and polymethyl methacrylate.

Optionally, the OLED display substrate further includes a pixel defining layer; wherein the pixel defining layer is located in the display region; or the pixel defining layer is located in a region surrounded by the retaining wall, and defines a plurality of auxiliary pixel regions in a region between the retaining wall and the display region, wherein the sacrificial layer is located in the auxiliary pixel region.

Optionally, the OLED display substrate further includes a moisture and oxygen barrier layer in the non-display region, wherein the moisture and oxygen barrier layer covers a surface of the retaining wall.

Optionally, the moisture and oxygen barrier layer further covers a surface of the display substrate on at least one side of the retaining wall.

At least one embodiment of the present disclosure provides a method for manufacturing an OLED display panel. The method includes:

forming a retaining wall on a display substrate, wherein the display substrate includes a display region and a non-display region surrounding the display region, and the retaining wall is located in the non-display region and surrounds the display region;

forming a sacrificial layer in a region between the retaining wall and the display region;

forming a printed film layer on the display substrate by inkjet printing, wherein a printing region covers a region surrounded by the retaining wall;

forming a residual layer of the sacrificial layer between the retaining wall and the display region by removing the printed film layer from the sacrificial layer;

obtaining a plurality of light-emitting structures by forming an electrode layer on the printed film layer in the display region; and forming a packaging structure on the display substrate by packaging the display substrate, wherein the packaging structure covers the plurality of light-emitting structures and is connected to the residual layer and the display substrate.

Optionally, removing the printed film layer from the sacrificial layer includes:

dripping a solvent for dissolving the sacrificial layer into the printed film layer on the sacrificial layer;

adhering the printed film layer on the sacrificial layer by an imprinting mold upon softening the sacrificial layer; and obtaining the residual layer by drying the solvent.

Optionally, the imprinting mold includes a printing plate adapted to the printed film layer on the sacrificial layer, wherein an adhesive is applied on the printing plate for adhering the printed film layer on the sacrificial layer.

Optionally, forming the retaining wall on the display substrate includes:

forming a resin material film layer on the display substrate; and obtaining the retaining wall and a pixel defining layer by patterning the resin material film layer, wherein the pixel defining layer is located in the display region; or the pixel defining layer is located in a region enclosed surrounded by the retaining wall, and defines a plurality of auxiliary pixel regions in a region between the retaining wall and the display region.

At least one embodiment of the present disclosure provides a display device. The display device includes any one of the above OLED display panels.

BRIEF DESCRIPTION OF THE DRAWINGS

FIG. 9 is a flowchart of a method for manufacturing an OLED display panel according to an embodiment of the present disclosure.

DETAILED DESCRIPTION

Figure 1:
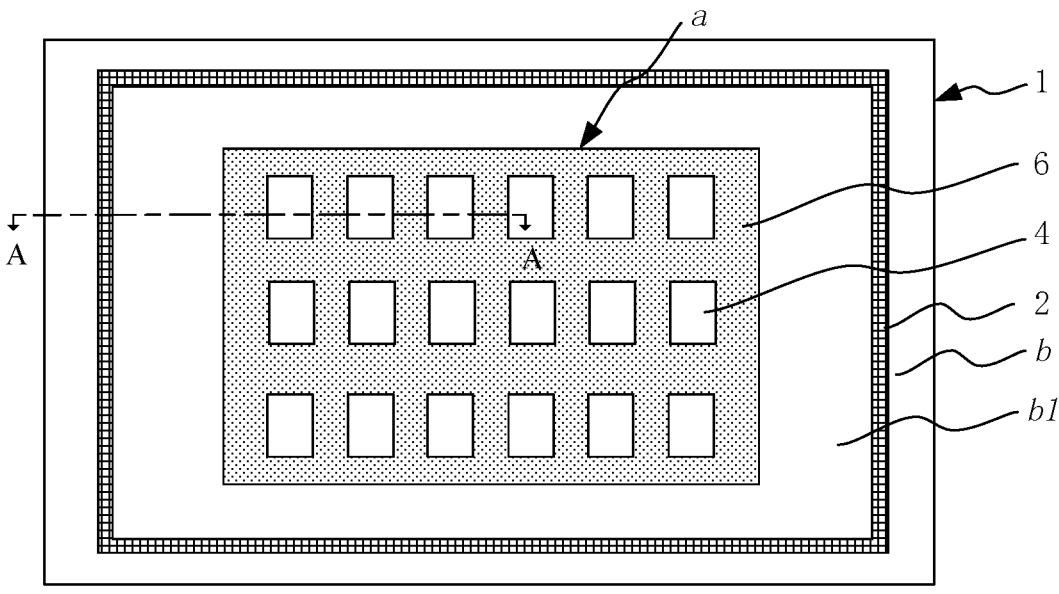
FIG. 1 is a top view of an OLED display substrate according to an embodiment of the present disclosure.

To further explain the technical means and effects adopted by the present disclosure for achieving the intended objectives of the present disclosure, specific embodiments, structures, features and effects of an organic light-emitting diode (OLED) display substrate, a display panel and a manufacturing method thereof, and a display device according to the present disclosure are described in detail below with reference to the accompanying drawings and optional embodiments.

In a manufacturing process of the OLED display substrate, an inkjet printing technology is usually performed to form an organic light-emitting functional layer. In the inkjet printing process, it is an essential step to remove a solvent in an ink by a subsequent process, so as to dry a solute, thereby forming a required thin film. As a solvent atmosphere in which sub-pixel structures at an edge of a display region of the display substrate are located is different from a solvent atmosphere in which sub-pixel structures in the middle of the display region (a solvent concentration at the edge of the display region is lower than a solvent concentration in the middle of the display region) are located, a solvent at the edge of the display region volatilizes faster than a solvent in the middle of the display region. As a result, film layers in a middle region and an edge region of the display region have different drying degrees, resulting in relatively poorer uniformity of the organic light-emitting functional layer of the display region, thereby affecting the display effect.

In the related art, an auxiliary region (dummy region) is disposed in a non-display region of the display substrate. Sub-pixel structures of the auxiliary region are the same as the sub-pixel structures of the display region. Ink droplets also drip into the auxiliary region during printing, such that the solvent atmosphere at the edge of the display region is increased. Thus, the drying degrees of the film layers in the middle region and the edge region of the display region are equivalent, thereby improving the uniformity of the organic light-emitting functional layer in the display region, and further improving the display effect.

Upon performing inkjet printing simultaneously in the auxiliary region and the display region, a printed film layer is formed on the display substrate corresponding to the auxiliary region, and cannot be peeled and removed from the display substrate after film formation. In the case that packaging is directly performed on the printed film layer, the printed film layer may form a pathway for moisture and oxygen ingress after packaging, and hence an OLED device on the display substrate may be corroded and damaged under the action of moisture and oxygen, affecting the packaging effect of the display substrate. Therefore, in the case where the printed film layer cannot be removed from the display substrate, a packaging region may only be disposed in a region except a region where the printed film layer is located, that is, the packaging region needs to be disposed at the periphery of the auxiliary region. This may lead to a relatively larger area of the non-display region of the OLED display panel, which is not conducive to the narrow bezel design of the display device.

FIG. 1 is a top view of an OLED display substrate according to an embodiment of the present disclosure. As shown in FIG. 1, the OLED display substrate includes a display substrate 1. The display substrate 1 has a display region a and a non-display region b surrounding the display region a. The display region a is configured to display a picture, and the non-display region b surrounds the display region a.

The OLED display substrate further includes a retaining wall 2 and a plurality of light-emitting structures 4. The retaining wall 2 is located in the non-display region b and surrounds the display region a. For convenience of description, a region between the retaining wall 2 and the display region a is called an auxiliary region. That is, the non-display region b includes the auxiliary region b1, the auxiliary region b1 surrounds edges of the display region a, and the retaining wall 2 is disposed around outer edges of the auxiliary region b1. The plurality of light-emitting structures 4 are located in the display region a and the display substrate 1 displays the picture by controlling the plurality of light-emitting structures 4 to emit light.

In the embodiment of the present disclosure, the plurality of light-emitting structures 4 are disposed in the display region a in an array. The plurality of light-emitting structures 4 may include light-emitting structures 4 of a plurality of colors, such as a red light-emitting structure 4, a blue light-emitting structure 4, and a green light-emitting structure 4. Each light-emitting structure 4 corresponds to a sub-pixel structure, and a plurality of sub-pixel structures constitute a pixel structure. Exemplarily, each light-emitting structure 4 includes two electrode layers and an organic light-emitting functional layer located between the two electrode layers.

Figure 2:
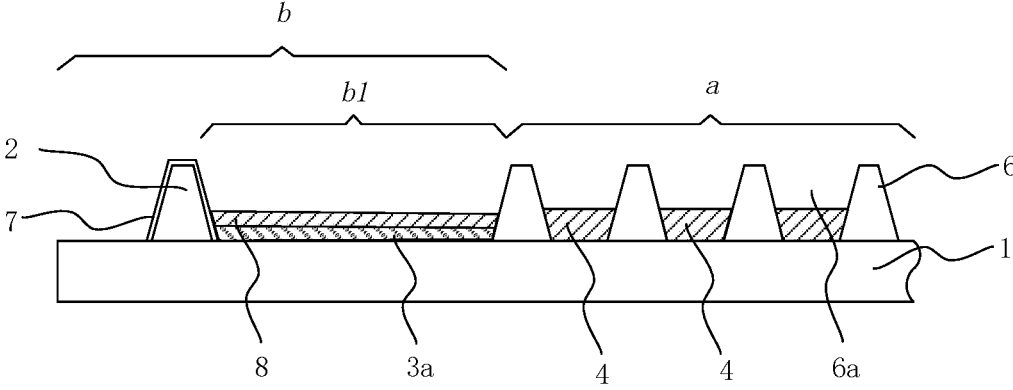
FIG. 2 is a sectional structural diagram of the OLED display substrate shown in FIG. 1 along a line A-A.

FIG. 2 is a sectional view of the OLED display substrate shown in FIG. 1 along a line A-A. With reference to FIGS. 1 and 2, the OLED display substrate further includes a sacrificial layer 3a and an organic layer 8. The sacrificial layer 3a is located between the retaining wall 2 and the display region a, that is, the sacrificial layer 3a is located in the auxiliary region b1. The organic layer 8 is located on the sacrificial layer 3a. The organic layer 8 and the organic light-emitting functional layer of the light-emitting structure 4 are in a same layer. Here, "the same layer" means that the organic layer 8 and the organic light-emitting functional layer of the light-emitting structure 4 are formed simultaneously by inkjet printing. The sacrificial layer 3a is configured to separate the organic layer 8 formed by inkjet printing in the auxiliary region b1.

As shown in FIGS. 1 and 2, the OLED display substrate further includes a pixel defining layer 6. The pixel defining layer 6 defines a plurality of pixel regions (also called opening regions) 6a in the display region a, and there is one light-emitting structure 4 in each pixel region 6a.

Exemplarily, in the embodiment shown in FIG. 1, the auxiliary region b1 is an annular region which is defined by the retaining wall 2 and the pixel defining layer 6 and surrounds the display region a, and the organic layer 8 is formed in the entire annular region. The annular region is part of the non-display region b and is configured for inkjet printing together with the display region a of the display substrate 1 during inkjet printing. The retaining wall 2 is configured to limit the region range of the auxiliary region b1 and prevent the ink from diffusing to the outside of the auxiliary region b1 during the inkjet printing, thereby avoiding pollution and damage to the equipment environment and a binding region.

In the embodiment of the present disclosure, after inkjet printing, an edge of a printing region is extended to the auxiliary region b1 at the periphery of the display region a, that is, a coverage range of the printing region is increased. In this way, the solvent atmosphere at the edge of the display region a can be increased, such that a difference of drying degree of the film layers at a middle portion and an edge portion of the display region a is reduced, thereby improving the uniformity of the printed film layers in the display region a of the display substrate 1. Thus, the display effect of the display panel is ensured.

Due to the poor combination between the organic film layer and a packaging structure, in the case that the packaging structure is directly formed on the organic light-emitting functional layer, in the process of subsequently using the display substrate, the organic light-emitting functional layer and the packaging structure may be separated at a combined position, resulting in packaging failure. In addition, in the case that the packaging structure is directly formed on the organic light-emitting functional layer, the organic light-emitting functional layer may form a pathway for moisture and oxygen ingress after the packaging, and hence the OLED device on the display substrate may be corroded and damaged under the action of moisture and oxygen, affecting the packaging effect of the display substrate.

For ensuring the packaging reliability, when packaging is performed at a position where the auxiliary region b1 is located, the printed film layer in the auxiliary region b1 (that is, the above organic layer 8) needs to be removed. The sacrificial layer 3a is disposed in the auxiliary region b1, located in a region surrounded by the retaining wall 2, and formed on a surface of the display substrate 1, and the sacrificial layer 3a can play roles of carrying printing ink during inkjet printing and removing the organic layer 8 upon forming the organic layer 8 by drying. In the process of removing the organic layer 8, the sacrificial layer 3a may be partially or completely peeled from the display substrate 1 and a material of the sacrificial layer 3a does not affect the packaging effect. Upon removing the organic layer 8, the display substrate may be packaged by coating a packaging adhesive in the auxiliary region b1. Thus, the narrow bezel design requirement of the display panel can be met.

In the embodiment of the present disclosure, the auxiliary region b1 is at least partially overlapped with the packaging region of the non-display region b, that is, the auxiliary region b1 is further configured to package the OLED display substrate. For example, a range of the auxiliary region b1 may be equal to or less than a range of a region which should be occupied by the packaging region. A specific range of the auxiliary region b1 may be set according to the practical situation, aiming to reduce a bezel size of the display panel, and ensuring that a setting range of the auxiliary region b1 cannot exceed an outer edge of the packaging region.

Optionally, the retaining wall 2 may be formed on the display substrate 1 by photoetching using a photosensitive resin organic material, of which the material and the manufacturing process of the retaining wall 2 are not limited to the above. The retaining wall 2 may be disposed in a plurality of specific forms.

Optionally, a height range of the retaining wall 2 may be 1 $\mu$m to 3 $\mu$m, and a width range of the retaining wall 2 may be 10 $\mu$m to 20 $\mu$m. The specific value of the height of the retaining wall 2 may be set according to actual demands, which aims to ensure that the jet ink cannot be spattered into a region outside the auxiliary region b1 in the process of inkjet printing.

In the embodiment of the present disclosure, the retaining wall 2 and the pixel defining layer 6 may be disposed in a same layer. Here, "the same layer" means that formation by a same patterning process, so as to simplify the manufacturing process.

The typical patterning process refers to a process that removes a photoresist by photoresist exposure, development and etching by using a mask once. When a material of the pixel defining layer 6 is a non-photosensitive material, after exposure and development, a region which is exposed by the photoresist and is to form an opening needs to be etched, so as to form the opening (that is, the above pixel region). When the material of the pixel defining layer 6 is a photo-sensitive material, exposure and development may be directly performed on the material of the pixel defining layer to form the opening.

Optionally, in the embodiment of the present disclosure, in order to prevent moisture and oxygen from entering the display region a along the pathway formed by the retaining wall 2 upon packaging the OLED display substrate 1, a moisture and oxygen barrier layer 7 for blocking moisture and oxygen may be disposed outside the retaining wall 2 to improve the packaging effect of the OLED display substrate 1 and ensure the packaging reliability.

Optionally, the moisture and oxygen barrier layer 7 may be made of a material having a moisture and oxygen barrier effect, such as $SiN_x$, $SiO_2$, SiC, $Al_2O_3$, ZnS, and ZnO, by chemical vapor deposition (CVD), sputtering, atomic layer deposition (ALD) or the like. Optionally, a thickness range of the moisture and oxygen barrier layer 7 may be 0.05 μm to 2.5 μm.

Figure 3:
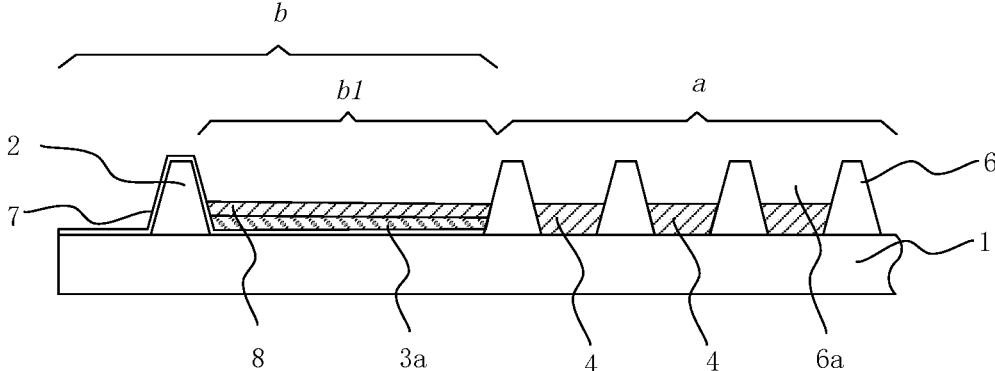
FIG. 3 is another sectional structural diagram of the OLED display substrate shown in FIG. 1 along the line A-A.

In one possible embodiment, as shown in FIG. 2, the moisture and oxygen barrier layer 7 only covers a surface of the retaining wall 2. In another possible embodiment, as shown in FIG. 3, the moisture and oxygen barrier layer 7 covers an upper surface of the display substrate at two sides of the retaining wall 2 except the surface of the retaining wall 2. In this way, the packaging structure is further assisted in playing a good role of blocking moisture and oxygen for a display device on the display substrate 1.

Optionally, the sacrificial layer 3a may be made of a soluble material, such that upon forming the printed film layer 4, the sacrificial layer 3a may be dissolved and softened through a corresponding solvent. With the soften-ing of the sacrificial layer 3a, the printed film layer 4 on the sacrificial layer 3a may be removed. The sacrificial layer 3a may be disposed in a plurality of specific forms, aiming to realize functions of separating the printed film layer 4 from the display substrate 1, and ensuring the packaging effect of the display substrate 1.

Exemplarily, the sacrificial layer 3a may be made of a soluble material soluble in a solvent, and the organic light-emitting functional layer of the light-emitting structure is insoluble in the solvent. In this way, when the sacrificial layer 3a is dissolved by the solvent, the entire layer structure of the organic layer 8 can be retained to facilitate removal of the entire layer structure from the display substrate 1.

Exemplarily, the sacrificial layer 3a is made of a soluble resin, plastic or rubber material.

When the sacrificial layer 3a is formed, a liquid material may be obtained by dissolving the selected material with a corresponding solvent, then the liquid material is filled in the auxiliary region b1 by spin-coating, printing, spraying and the like and located in a region surrounded by the retaining wall 2, and finally the sacrificial layer 3a is formed after drying, removing the solvent and curing.

Upon forming the organic layer 8 by performing ink-jet printing on the sacrificial layer 3a, the above solvent may be dripped along the inner side of the retaining wall 2 and/or on the surface of the organic layer 8. The solvent may permeate to the sacrificial layer 3a through mesh holes in the organic layer 8, such that the sacrificial layer 3a may be dissolved and softened. With the softening of the sacrificial layer 3a, the organic layer 8 may be peeled from the display substrate 1, and thus the organic layer 8 is removed from the display substrate 1, thereby facilitating the packaging operation in the auxiliary region b1.

Optionally, the sacrificial layer 3a may be made of one or more of polyethylene glycol, polycaprolactone, polyvinyl alcohol, polyvinylpyrrolidone and polymethyl methacrylate, and the solvent for dissolving the sacrificial layer 3a may be ethanol, isopropanol, acetone and the like.

Figure 4:
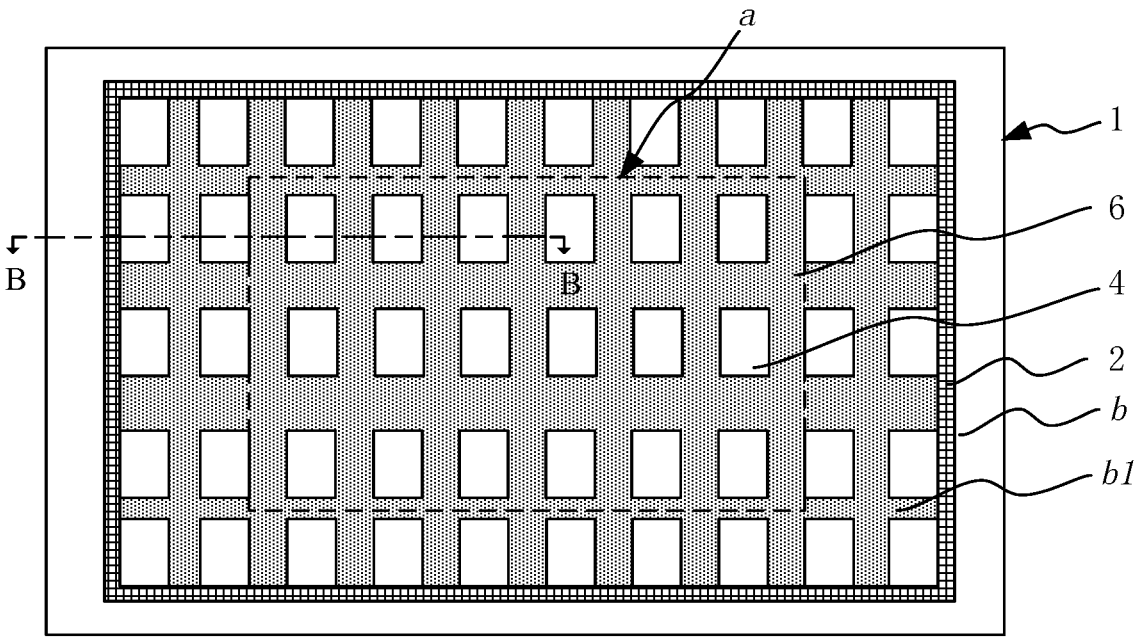
FIG. 4 is a top view of another OLED display substrate according to an embodiment of the present disclosure.

FIG. 4 is a top view of another OLED display substrate according to an embodiment of the present disclosure. The structure of the OLED display substrate shown in FIG. 4 is basically the same as the structure of the OLED display substrate shown in FIG. 1, and the difference between the structure of the OLED display substrate shown in FIG. 4 and the structure of the OLED display substrate shown in FIG. 1 is that in the OLED display substrate shown in FIG. 4, the pixel defining layer 6 is located in the region surrounded by the retaining wall 2, that is, the pixel defining layer 6 is located in both the display region a and the auxiliary region b1.

Figure 5:
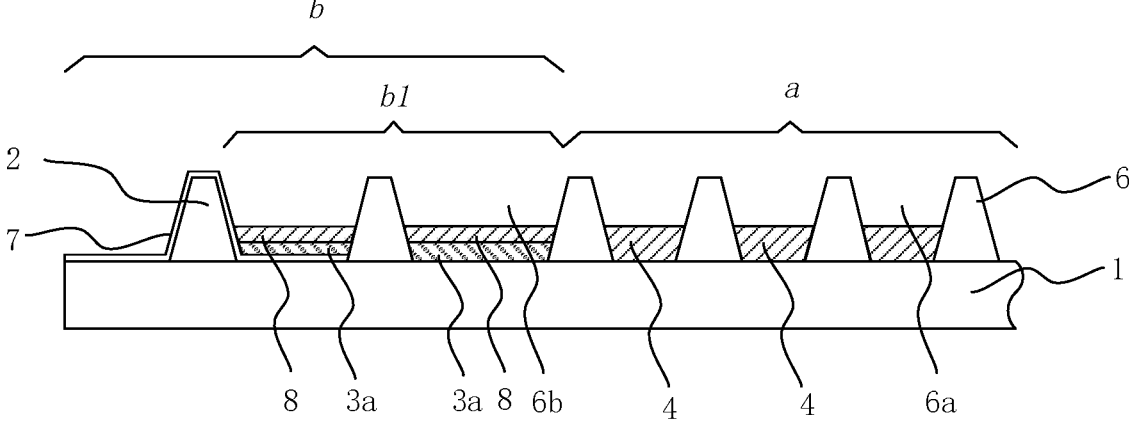
FIG. 5 is a sectional structural diagram of the OLED display substrate shown in FIG. 4 along a line B-B.

FIG. 5 is a sectional structural diagram of the display substrate shown in FIG. 4 along a line B-B. As shown in FIG. 5, the pixel defining layer 6 defines a plurality of pixel regions 6a in the display region a, and there is one light-emitting structure 4 in each pixel region 6a. The pixel defining layer 6 defines a plurality of auxiliary pixel regions 6b in the auxiliary region b1. The sacrificial layer 3a and the organic layer 8 are located in the auxiliary pixel region 6b.

Figure 6:
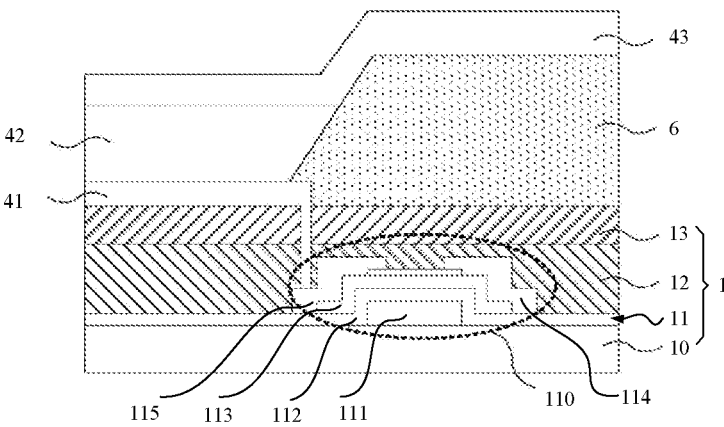
FIG. 6 is a diagram of a hierarchical structure of a display region of the OLED display substrate according to the embodiment of the present disclosure.

FIG. 6 is a diagram of a hierarchical structure of the display region of the OLED display substrate shown in FIGS. 1 and 4. As shown in FIG. 6, the OLED display substrate includes a display substrate 1, and an anode layer 41, a pixel defining layer 6, an organic light-emitting func-tional layer 42, and a cathode layer 43 that are located on the display substrate 1. The anode layer 41, the organic light-emitting functional layer 42, and the cathode layer 43 are sequentially stacked on the display substrate 1 to form a light-emitting structure 4.

Exemplarily, the organic light-emitting functional layer may include a hole injection layer, a hole transport layer, a light-emitting layer, an electron transport layer, and an electron injection layer that are sequentially stacked. The hole injection layer is connected with the anode layer, and the electron injection layer is connected with the cathode layer.

The display substrate 1 includes a base substrate 10, and a thin film transistor (TFT) array structure layer 11, a protective layer 12, and a planarization layer 13 that are sequentially located on the base substrate 10. Exemplarily, the TFT array structure layer 11 includes a plurality of TFTs 110. Each light-emitting structure 4 corresponds to at least two TFTs 110, and each light-emitting structure 4 and the corresponding TFTs 110 constitute a sub-pixel structure.

As shown in FIG. 6, the TFT 110 includes a gate 111, a gate insulating layer 112, an active layer 113, a source 114, a drain 115 and the like. The gate insulating layer 112 covers the gate 111, the active layer 113 is on the gate insulating layer 112, the source 114 and the drain 115 are connected with the active layer 113 respectively, and the drain 115 is connected with the anode layer 41. In FIG. 6, the structure of the TFT is illustrated by taking a bottom-gate structure as an example, but in the embodiment of the present disclosure, TFTs of other structures may also be adopted, which is not limited in the present disclosure.

Figure 7:
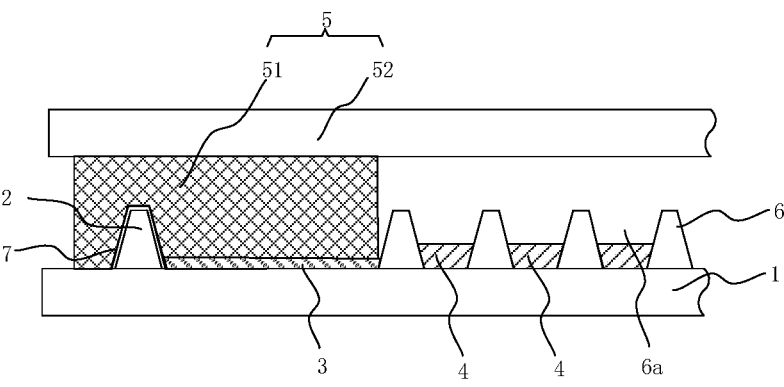
FIG. 7 is a structural diagram of an OLED display panel according to an embodiment of the present disclosure.

FIG. 7 is a structural diagram of an OLED display panel according to an embodiment of the present disclosure. As shown in FIG. 7, the OLED display panel includes a display substrate 1, a retaining wall 2, a residual layer 3, a plurality of light-emitting structures 4, and a packaging structure 5.

Figure 8:
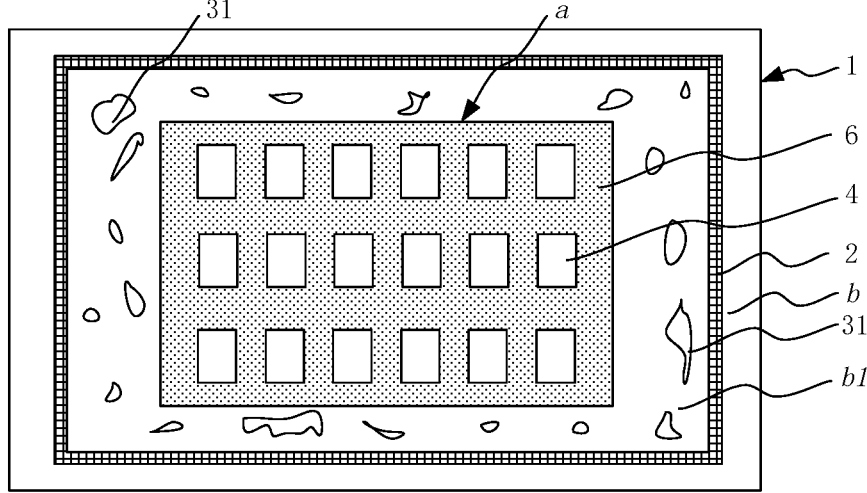
FIG. 8 a top view of the OLED display panel shown in FIG. 7 with a packaging structure removed.

FIG. 8 is a top view of the OLED display panel shown in FIG. 7 with the packaging structure removed. With reference to FIGS. 7 and 8, the display substrate 1 has a display region a and a non-display region b surrounding the display region a. The plurality of light-emitting structures 4 are located in the display region a. The retaining wall 2 is located in the non-display region b and surrounds the display region a. The residual layer 3 is located between the retaining wall 2 and the display region a.

The structure shown in FIG. 8 is a structure obtained by removing the printed film layer from the sacrificial layer of the OLED display substrate shown in FIG. 2. As shown in FIG. 8, the residual layer 3 includes a plurality of unconnected residual portions 31 dispersed between the retaining wall 2 and the display region a. Part of the material of the sacrificial layer 3a is taken away when the organic layer 8 is removed, and the residual solute obtained upon evaporating the solvent in the sacrificial layer 3a is the residual layer 3. As there is a fewer of material of the sacrificial layer 3a left in the auxiliary region b1 upon removing the organic layer 8, the residual portion 31 obtained after solvent evaporation is in a dispersed blocky structure, the shape of these blocky structures is random and irregular. It should be noted that the residual layer 3 in FIG. 7 is located in the entire region between the retaining wall 2 and the pixel defining layer 6. In fact, the residual layer 3 probably only exists in part of the region between the retaining wall 2 and the pixel defining layer 6.

As shown in FIG. 7, the packaging structure 5 includes a packaging cover plate 52 and a packaging adhesive 51. The packaging cover plate is disposed opposite to the display substrate 1. The packaging adhesive 51 is adhered between the display substrate 1 and the packaging cover plate 52, and is at least partially located in the auxiliary region b1. For example, in FIG. 7, the packaging adhesive 51 is located at the periphery of the retaining wall 2 except the auxiliary region b1.

Optionally, the packaging cover plate is a transparent cover plate, including but not limited to a glass cover plate, a plastic cover plate or the like.

Optionally, the OLED display panel may further include a filling adhesive located between the plurality of light-emitting structures 4 of the display substrate and packaging cover plate. Exemplarily, the filling adhesive may be an optical adhesive.

It should be noted that in FIG. 7, the packaging adhesive 51 is located in the entire auxiliary region b1, but in other embodiments, the packaging adhesive 51 may only be located in a circle of annular region of the auxiliary region b1 proximal to the retaining wall 2. The region surrounded by the packaging adhesive 51 is filled with the filling adhesive.

Alternatively, in other embodiments, the packaging structure may also be a thin film packaging structure. The thin film packaging structure includes at least one organic packaging layer and at least one inorganic packaging layer. For example, the thin film packaging structure includes two inorganic packaging layers and an organic packaging layer located between these two inorganic packaging layers.

It should be noted that the OLED display substrate shown in FIG. 8 may be replaced with a structure obtained by removing the printed film layer from the sacrificial layer of the OLED display substrate shown in FIG. 3 or FIG. 5.

FIG. 9 is a flowchart of a method for manufacturing an OLED display panel according to an embodiment of the present disclosure. As shown in FIG. 9, the method for manufacturing the OLED display panel according to the embodiment of the present disclosure includes the following steps.

In step S1, a retaining wall 2 is formed in a non-display region b of a display substrate 1.

The display substrate 1 has a display region and the non-display region surrounding the display region, and the retaining wall 2 is located in the non-display region b and surrounds the display region a. The non-display region between the retaining wall 2 and the display region a is called an auxiliary region which surrounds the display region and is adjacent to the display region.

During manufacturing, a range of the auxiliary region b1 is firstly determined in the non-display region b of the display substrate 1. The auxiliary region b1 surrounds the periphery of the display region a, and the range of auxiliary region b1 is limited by disposing the retaining wall 2 at the periphery of the auxiliary region b1. In this way, ink droplets are prevented from diffusing to a region outside the auxiliary region b1 during inkjet printing. In the embodiment of the present disclosure, a preset range of the auxiliary region b1 may be set to correspond to a packaging region of the display substrate 1. During setting, it is possible to make the range of the auxiliary region b1 not greater than a range of the packaging region of the non-display region b.

For example, the retaining wall 2 may be formed from a photosensitive resin organic material by photoetching. This method is simple to operate and can improve the manufacturing efficiency. Exemplarily, the retaining wall 2 may have a height of 1 μm to 3 μm and a width of 10 μm to 20 μm.

In one possible embodiment, the retaining wall 2 and a pixel defining layer 6 may be manufactured simultaneously. In this case, the step S1 may include: forming a resin material film layer on the display substrate; and obtaining the retaining wall and the pixel defining layer by patterning the resin material film layer. The pixel defining layer is located in the display region; or the pixel defining layer is located in the display region and the auxiliary region, and defines a plurality of auxiliary pixel regions in the auxiliary region.

Here, patterning refers to the above patterning process. The typical patterning process refers to such a process that removes a photoresist through photoresist exposure, development and etching by using a mask once. When materials of the pixel defining layer 6 and the retaining wall 2 are non-photosensitive materials, after exposure and development, a region which is exposed by the photoresist and is to form an opening needs to be etched, so as to form the opening. When the materials of the pixel defining layer 6 and the retaining wall 2 are photosensitive materials, exposure and development may be directly performed on the material of the pixel defining layer to form the opening.

In step S2, a sacrificial layer 3a is formed in the auxiliary region b1.

Upon disposing the retaining wall 2, the sacrificial layer 3a is formed in the auxiliary region b1. The sacrificial layer 3a is configured to separate a printed film layer on the sacrificial layer 3a from the display substrate 1 upon forming the printed film layer by inkjet printing, so as to remove the printed film layer in the auxiliary region b1.

Optionally, the sacrificial layer 3a may be made of one or more of polyethylene glycol, polycaprolactone, polyvinyl alcohol, polyvinylpyrrolidone and polymethyl methacrylate, that is, the sacrificial layer 3a may be made of a soluble material, so as to remove the printed film layer on the sacrificial layer 3a.

When the sacrificial layer 3a is formed, a liquid material may be obtained by dissolving the selected material of the sacrificial layer 3a with a corresponding solvent, then the liquid material is filled in the auxiliary region b1 by spin-coating, printing, spraying and the like, and the sacrificial layer 3a is formed upon performing drying to remove the solvent followed by curing.

In step S3, the printed film layer is formed on the display substrate 1 by inkjet printing.

A printing region covers the display region a and the auxiliary region b1. Accordingly, the formed printed film layer includes an organic layer 8 on the sacrificial layer 3a and an organic light-emitting functional layer in a light-emitting structure 4.

Upon forming the sacrificial layer 3a, inkjet printing is performed on the display substrate 1, and the printing region covers the display region a and the auxiliary region b1. That is, an edge of the printing region is extended to the auxiliary region b1, such that a coverage range of the printing region is increased. In this way, a solvent atmosphere at the edge of the display region a can be increased, such that a difference of drying degree of the film layers at a middle portion and an edge portion of the display region a is reduced, thereby improving the uniformity of the printed film layer in the display region a of the OLED display substrate 1. Thus, the display effect of the display panel can be ensured.

In step S4, the printed film layer 4 on the sacrificial layer 3a is removed.

In the step S4, the printed film layer on the sacrificial layer 3a is peeled from the display substrate by the sacrificial layer 3a.

In step S5, a plurality of light-emitting structures are obtained by forming an electrode layer on the printed film layer in the display region.

Here, the printed film layer in the display region is the organic light-emitting functional layer.

In step S6, a packaging structure is formed on the display substrate by packaging the display substrate 1.

The packaging structure 5 covers the plurality of light-emitting structures 4 and is connected to the residual layer 3 in the auxiliary region b1 and the display substrate 1.

Upon removing the printed film layer 4, the display substrate 1 is packaged, and a packaging region is not less than a region where the auxiliary region b1 is located. For example, as shown in FIG. 7, the auxiliary region b1 is coated with a packaging adhesive 51, and the packaging adhesive 51 covers the retaining wall 2 and may extend to an outer side region of the retaining wall 2. The display substrate 1 is adhered to a packaging cover plate 52 by the packaging adhesive 51.

In the method for manufacturing the OLED display panel according to the embodiment of the present disclosure, the coverage range of the printing region may be increased by disposing the auxiliary region, such that the difference of the drying degree at the middle portion and the edge portion of the display region is reduced, thereby achieving relatively high uniformity of the printed film layer in the display region of the display substrate. As the sacrificial layer is disposed in the auxiliary region, and the sacrificial layer can play a role of removing the printed film layer upon forming the printed film layer in the auxiliary region by inkjet printing. Upon removing the printed film layer, packaging can be directly performed in the auxiliary region, that is, the auxiliary region serves as the packaging region. Compared this with the case where the packaging region is at the periphery of the auxiliary region, the area of the non-display region is significantly reduced, thereby satisfying the narrow bezel design requirement of the display panel.

The structure of the retaining wall 2 manufactured by the photoresist have no moisture and oxygen barrier performance, such that a packaging effect may be affected. For avoiding a pathway for moisture and oxygen ingress formed by the structure of the retaining wall 2, the method for manufacturing the OLED display panel according to the embodiment of the present disclosure may further include: a moisture and oxygen barrier layer 7 is formed on the retaining wall 2.

The moisture and oxygen barrier layer 7 may be made of a material having a moisture and oxygen barrier effect, such as $SiN_x$, $SiO_2$, SiC, $Al_2O_3$, ZnS, and ZnO, by chemical vapor deposition (CVD), sputtering, atomic layer deposition (ALD) or the like.

Exemplarily, a thickness range of the moisture and oxygen barrier layer 7 may be 0.05 μm to 2.5 μm, which is not limited to this, aiming to form a film layer for blocking moisture and oxygen outside of the retaining wall 2, and ensuring the packaging reliability of the display substrate 1.

In one possible embodiment, the moisture and oxygen barrier layer 7 covers a surface of the retaining wall 2. In another possible embodiment, the moisture and oxygen barrier layer 7 covers an upper surface of the display substrate 1 at two sides of the retaining wall 2 except the surface of the retaining wall 2. In this way, the packaging structure is further assisted in playing a good role of blocking moisture and oxygen for a display device on the display substrate 1.

Optionally, the step S4 may include: dripping a solvent for softening the sacrificial layer 3a in the retaining wall 2, adhering the printed film layer on the sacrificial layer by an imprinting mold upon softening the sacrificial layer 3a, and drying the solvent.

The purpose of disposing the sacrificial layer 3a is to carry ink droplets during inkjet printing, and to remove the printed film layer on the sacrificial layer 3a upon forming the printed film. The printed film layer may be removed by various methods, that is, the sacrificial layer 3a may be disposed in a plurality of forms. For example, the sacrificial layer 3a may be made of a material such as soluble resin, plastic, or rubber or the like.

Upon forming the printed film layer on the sacrificial layer 3a by inkjet printing, the above solvent may be dripped along the inner side of the retaining wall 2 and/or on the surface of the printed film layer in the auxiliary region. The solvent may permeate to the sacrificial layer 3a through mesh holes in the printed film layer, such that the sacrificial layer 3a may be dissolved and softened. With the softening of the sacrificial layer 3a, the printed film layer in the auxiliary region may be adhered by the imprinting mold 9, such that the printed film layer in the auxiliary region may be peeled from the display substrate 1, and the printed film layer in the auxiliary region may be removed from the display substrate 1. When this printed film layer is removed, the sacrificial layer 3a may be completely or partly removed from the display substrate 1 by the printed film layer. The material of the remaining sacrificial layer 3a may be dried to remove the solvent, and the remaining sacrificial layer 3a (that is, the above residual layer) may not affect the packaging by a packaging material. The residual layer in the auxiliary region b1 and the display substrate may be coated with the packaging adhesive 51. Of course, the packaging region (that is, a region in which the packaging adhesive 51 is coated) may be greater than a region occupied by the auxiliary region b1. Upon coating the packaging adhesive

51, the packaging cover plate 52 may be buckled with the display substrate to complete the packaging of the display substrate 1.

Optionally, the above solvent for dissolving the sacrificial layer may be ethanol, isopropanol, acetone and the like.

Figure 10:
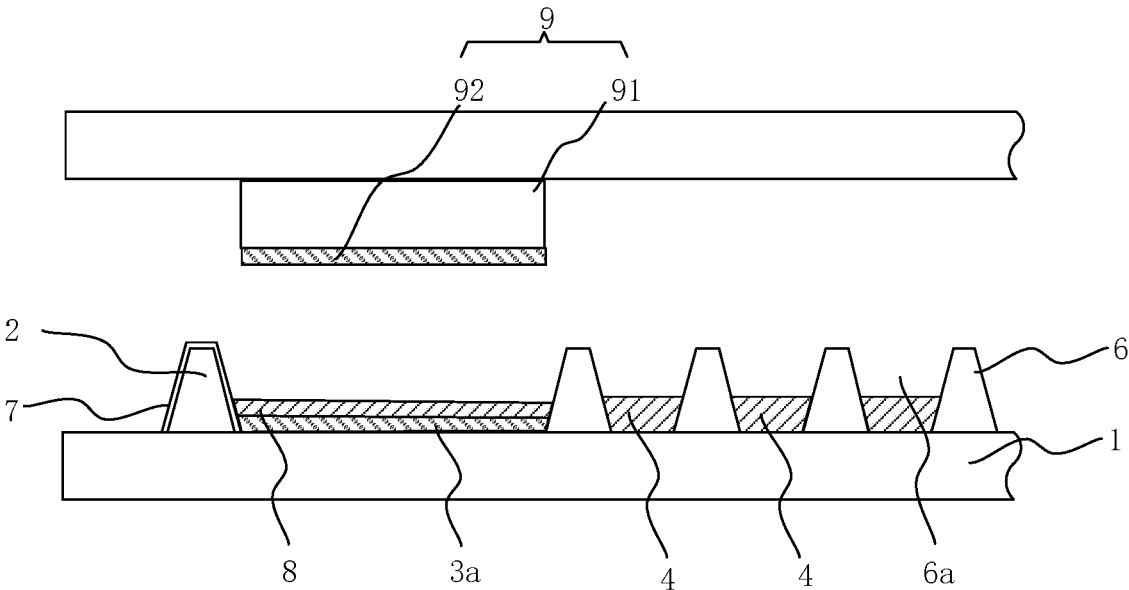
FIG. 10 is a structural diagram of an imprinting mold used in the method for manufacturing the OLED display panel according to the embodiment of the present disclosure.

As shown in FIG. 10, the imprinting mold 9 may include a printing plate 91 adapted to the printed film layer in the auxiliary region b1. An adhesive 92 is applied on the printing plate 91 for adhering the printed film layer on the sacrificial layer 3a, that is, the organic layer 8. The imprinting mold 9 plays a role of removing the organic layer 8. The imprinting mold 9 includes the printing plate 91. The size and shape of the printing plate 91 may be adapted to the size and shape of the organic layer 8, and a thickness of the printing plate 91 may be greater than a height of the retaining wall 2, so as to completely contact the organic layer 8 when the organic layer 8 is removed. The adhesive 92 is applied on a surface of the printing plate 91 in contact the organic layer 8. The adhesive 92 is configured to adhere the organic layer 8 when contacting the organic layer 8, and then to remove the organic layer 8 from the display substrate.

Optionally, the printing plate 91 may be made of a resilient resin-like material. The adhesive 92 may be a rubber-based adhesive or an acrylic adhesive. Optionally, a thickness range of the adhesive 92 on the printing plate 91 may be 50 nm to 500 nm.

An embodiment of the present disclosure further provides a display device including the above OLED display panel.

Exemplarily, the display device may be an electronic device having a display function, such as a television, a mobile phone, or a tablet computer.

The embodiment of the present disclosure provides the display device, which can increase the coverage range of the display substrate for inkjet printing by expanding the printing region to the periphery of the display region, such that the difference of the drying degree of the film layers at the middle portion and the edge portion of the display region of the display substrate is reduced, thereby improving the uniformity of the printed film layer at the edge of the printing region of the display region of the display substrate. Thus, the display effect of the display device is ensured. As the sacrificial layer is disposed in the auxiliary region, the sacrificial layer can play a role of assisting in removing the printed film layer upon forming the printed film layer in the auxiliary region by inkjet printing. In addition, the auxiliary region is at least partially overlapped with the packaging region of the display substrate, upon removing the printed film layer, packaging can be directly performed in the auxiliary region. Thus, the narrow bezel design requirement of the display panel is satisfied, that is, the size of the bezel of the display panel can be reduced, and the screen-to-body ratio of the display device can be increased, thereby providing users with better visual enjoyment.

The above description is merely specific embodiments of the present disclosure, but the scope of protection of the present disclosure is not limited thereto. Any changes or replacements that would be easily thought by any person skilled in the art within the technical scope disclosed in the present disclosure should be within the scope of protection of the present disclosure. Therefore, the scope of protection of the present disclosure shall be subject to the scope of protection defined by the claims.

What is claimed is:

1. An organic light-emitting diode (OLED) display panel, comprising:

a display substrate comprising a display region and a non-display region surrounding the display region, wherein the non-display region comprises an auxiliary region, the auxiliary region surrounding edges of the display region, and the auxiliary region and the display region are configured for inkjet printing simultaneously in a time-synchronized manner;

a retaining wall which is in the non-display region and surrounds the display region, wherein the retaining wall is disposed around outer edges of the auxiliary region;

a sacrificial layer disposed in the entire auxiliary region and configured to carry printing ink during the inkjet printing and remove an organic layer upon forming the organic layer by drying;

a plurality of light-emitting structures in the display region, wherein each of the light-emitting structures comprises an organic light-emitting functional layer; and the organic layer on the sacrificial layer, wherein the organic layer and the organic light-emitting functional layer are in a same layer;

wherein the sacrificial layer is made of a soluble resin, plastic or rubber material in a solvent, the organic light-emitting functional layer is insoluble in the solvent, such that when the sacrificial layer is dissolved by the solvent, an entire layer structure of the organic layer is capable of being retained and removed from the display substrate.

2. The OLED display substrate according to claim 1, wherein the soluble material comprises at least one of polyethylene glycol, polycaprolactone, polyvinyl alcohol, polyvinylpyrrolidone, and polymethyl methacrylate.

3. The OLED display substrate according to claim 1, further comprising a pixel defining layer; wherein the pixel defining layer is in the display region; or the pixel defining layer is in a region surrounded by the retaining wall, and defines a plurality of auxiliary pixel regions in a region between the retaining wall and the display region, wherein the sacrificial layer is in the auxiliary pixel region.

4. The OLED display substrate according to claim 1, further comprising a moisture and oxygen barrier layer in the non-display region, wherein the moisture and oxygen barrier layer covers a surface of the retaining wall.

5. The OLED display substrate according to claim 4, wherein the moisture and oxygen barrier layer further covers a surface of the display substrate on at least one side of the retaining wall.

6. A display device, comprising the OLED display panel as defined in claim 1.

7. A method for manufacturing an organic light-emitting diode (OLED) display panel, comprising:

forming a retaining wall on a display substrate, wherein the display substrate comprises a display region and a non-display region surrounding the display region, and the retaining wall is in the non-display region and surrounds the display region, wherein the non-display region comprises an auxiliary region, the auxiliary region surrounding edges of the display region, and the auxiliary region and the display region are configured for inkjet printing simultaneously in a time-synchronized manner, wherein the retaining wall is disposed around outer edges of the auxiliary region;

forming a sacrificial layer disposed in the entire auxiliary region and configured to carry printing ink during the inkjet printing and remove an organic layer upon forming the organic layer by drying;

forming a printed film layer on the display substrate by the inkjet printing, wherein a printing region covers a region surrounded by the retaining wall;

forming a residual layer of the sacrificial layer between the side of the retaining wall facing towards the display region and the edge of the display region by removing the printed film layer from the sacrificial layer;

obtaining a plurality of light-emitting structures by forming an electrode layer on the printed film layer in the display region, wherein each of the light-emitting structures comprises an organic light-emitting functional layer; and forming a packaging structure on the display substrate by packaging the display substrate, wherein the packaging structure covers the plurality of light-emitting structures and is connected to the residual layer and the display substrate;

wherein the sacrificial layer is made of a soluble resin, plastic or rubber material in a solvent, the organic light-emitting functional layer is insoluble in the solvent, such that when the sacrificial layer is dissolved by the solvent, an entire layer structure of the organic layer is capable of being retained and removed from the display substrate.

8. The method according to claim 7, wherein removing the printed film layer from the sacrificial layer comprises:

dripping the solvent for dissolving the sacrificial layer into the printed film layer on the sacrificial layer;

adhering the printed film layer on the sacrificial layer by an imprinting mold upon softening the sacrificial layer; and obtaining the residual layer by drying the solvent.

9. The method according to claim 8, wherein the imprinting mold comprises a printing plate adapted to the printed film layer on the sacrificial layer, wherein an adhesive is applied on the printing plate for adhering the printed film layer on the sacrificial layer.

10. The method according to claim 7, wherein forming the retaining wall on the display substrate comprises:

forming a resin material film layer on the display substrate; and obtaining the retaining wall and a pixel defining layer by patterning the resin material film layer, wherein the pixel defining layer is located in the display region; or the pixel defining layer is located in a region surrounded by the retaining wall, and defines a plurality of auxiliary pixel regions in a region between the retaining wall and the display region.

* * * * *